(12) United States Patent
Rubenstein et al.

(10) Patent No.: US 6,967,843 B2
(45) Date of Patent: Nov. 22, 2005

(54) SYSTEM AND METHOD FOR DISSIPATING HEAT FROM AN ELECTRONIC BOARD

(75) Inventors: Brandon A. Rubenstein, Loveland, CO (US); Bradley E. Clements, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 53 days.

(21) Appl. No.: 10/364,093

(22) Filed: Feb. 11, 2003

(65) Prior Publication Data

US 2004/0156174 A1    Aug. 12, 2004

(51) Int. Cl.[7] .............................................. H05K 7/20
(52) U.S. Cl. ..................... 361/703; 361/704; 165/80.3; 257/712
(58) Field of Search ............................... 361/688, 689, 361/699, 703, 704, 715–719; 174/35 R; 165/80.3; 257/712, 717

(56) References Cited

U.S. PATENT DOCUMENTS

| | | | | |
|---|---|---|---|---|
| 3,167,322 A | * | 1/1965 | Aichroth | 277/453 |
| 4,092,697 A | * | 5/1978 | Spaight | 361/718 |
| 6,016,006 A | * | 1/2000 | Kolman et al. | 257/712 |
| 6,175,501 B1 | | 1/2001 | Bortolini et al. | |
| 6,424,532 B2 | * | 7/2002 | Kawamura | 361/708 |
| 6,462,271 B2 | * | 10/2002 | Coffin et al. | 174/52.1 |
| 6,552,906 B2 | * | 4/2003 | Kanada | 361/705 |
| 6,625,025 B1 | * | 9/2003 | Duxbury et al. | 361/704 |

OTHER PUBLICATIONS www.aavidthermalloy.com, AAVID Thermalloy, "Heat Sinks for Memory", Cool-Covers™.

* cited by examiner

Primary Examiner—Lynn Feild
Assistant Examiner—Anthony Q. Edwards

(57) ABSTRACT

Disclosed is an electronic board comprising a plurality of individual devices, each device having a plurality of connectors, the connectors mated to receptacles on the board, and a heat dissipating cover connected to the board and forming a cavity incarcerating the plurality of devices, the cover thermally contacting a plurality of the individual devices, the cover having a dimensional pattern such that its outer surface area is greater than its planar area.

9 Claims, 3 Drawing Sheets

SYSTEM AND METHOD FOR DISSIPATING HEAT FROM AN ELECTRONIC BOARD

FIELD OF THE INVENTION

This invention relates generally to electronic circuit boards and more particularly to electronic circuit boards where uniform heat dissipation is desired and even more particularly to a system and method for dissipating heat from an electronic board.

DESCRIPTION OF RELATED ART

It is well-known that components on electronic boards generate heat which then should be dissipated so as not to interfere with the proper operation of the components. Generally, such heat dissipation is accomplished by blowing air along an axis of the board, allowing the air to contact the components on the electronic board. The moving air carries the heat away. Such a technique is shown in FIG. 3, where the arrows represent air blowing over components 31 on electronic board 30.

As shown in the more specific example of FIG. 4, circuit devices, such as memories 11, are connected to electronic board 12, either by soldering the connector pins to the board or by plugging the pins into mating sockets. These devices, as well as the board, are cooled by air flowing over the board, usually in a lengthwise direction, as represented in FIG. 3.

In an attempt to improve heat dissipation, a cover, such as cover 41, can be placed over the individual electronic devices, here memories 11, and air is passed over the cover. The cover may contact each device and serves to remove heat from the top surface of the device. A heat transfer element, such as heat transfer element 42, may be positioned over the individual electronic devices, here memories 11, to help transfer heat from the devices to the cover. While the cover may somewhat improve heat dissipation with respect to heat generated by the devices, it does not address the issue of hot spots of board 12, such as those associated with heat from the connector pins which have small physical surface area and thus are poor at heat transfer.

BRIEF SUMMARY OF THE INVENTION

An embodiment of the present invention provides an electronic board comprising a plurality of individual devices, each device having a plurality of connectors, the connectors mated to receptacles on the board, and a heat dissipating cover connected to the board and forming a cavity incarcerating the plurality of devices, the cover thermally contacting a plurality of the individual devices, the cover having a dimensional pattern such that its outer surface area is greater than its planar area.

Another embodiment of the present invention provides a thermal conductivity cover for use in increasing heat dissipation from an electronic circuit board, the circuit board having a plurality of electronic devices electronically connected to the circuit board by connectors, the cover comprising a plate having a relatively flat inner surface and having a planer area for thermally mating with ones of the electronic devices, the plate further having an outer surface for contact with air, the outer surface having an area greater than the planer area of the inner surface, and a rim coupled to the plate sized and shaped to cooperate with the plate to incarcerate electronic devices of the plurality of electronic devices within a cavity defined by the rim, the plate, and the electronic circuit board.

An embodiment of the present invention provides a method of assembling an electronic board, the method comprising connecting a plurality of electronic devices to the electronic board using a plurality of connectors, the electronic devices having top surfaces accessible when connected to the electronic board, positioning a cover over the top surfaces of the devices, and inserting thermally conductive material among the devices such that the thermally conductive material provides thermal conductivity between the cover and the devices as well as between the cover and the connectors of the devices.

Another embodiment of the present invention provides a method for providing increased heat transfer with respect to components disposed upon a circuit board, the method comprising positioning a device cover over the components, fastening the device cover to the circuit board, and inserting a thermally conductive material into a cavity formed between the device cover and the circuit board after fastening the device cover to the circuit board.

DETAILED DESCRIPTION

Figure 1A:
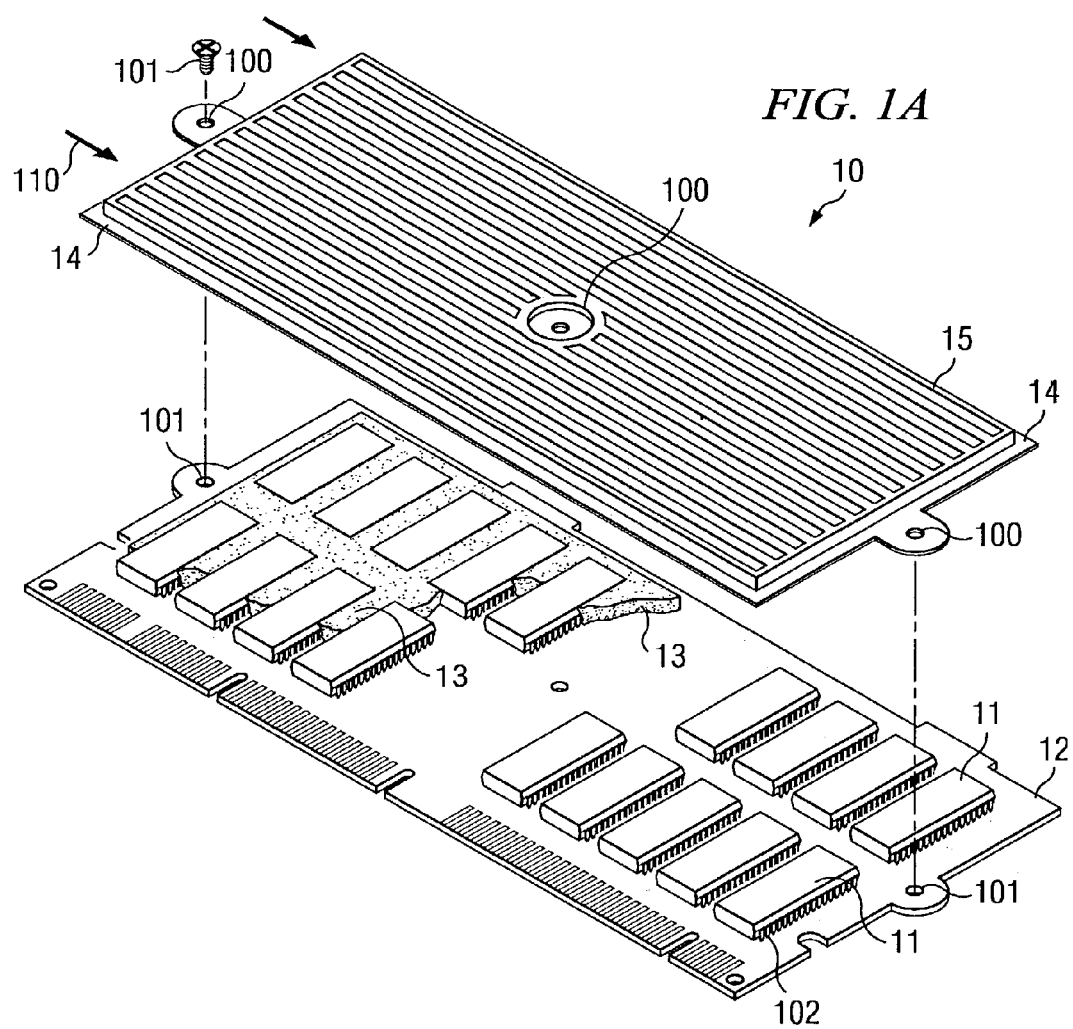
FIG. 1A shows an exploded view of a heat dissipating package according to an embodiment of the present invention.

FIG. 1A shows an exploded view of heat dissipating package 10 according to one embodiment of the present invention comprising of a plurality of individual electronic devices 11 mounted on electronic or circuit board 12. According to the illustrated embodiment, thermal material 13 is dispersed between devices 11 and device cover 15. Thermal material 13, in a one embodiment, is in a free-form or highly malleable form, such as Shin-Etsu G-751 thermally conductive grease, and substantially fills the volume of the cavity between device cover 15 and circuit board 12. In this context, free-form material is other than air.

Figure 2:
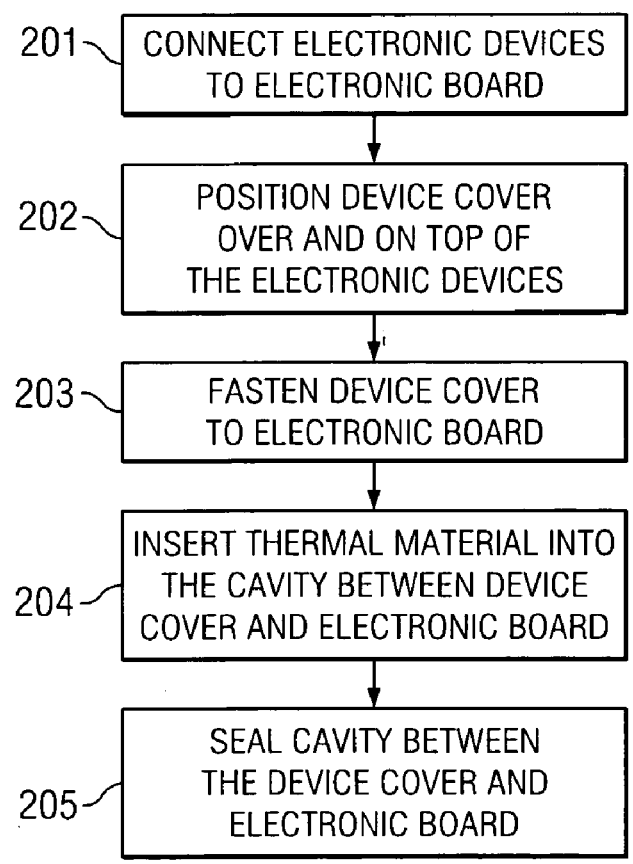
FIG. 2 shows a flow diagram according to an embodiment of the present invention.
Figure 3:
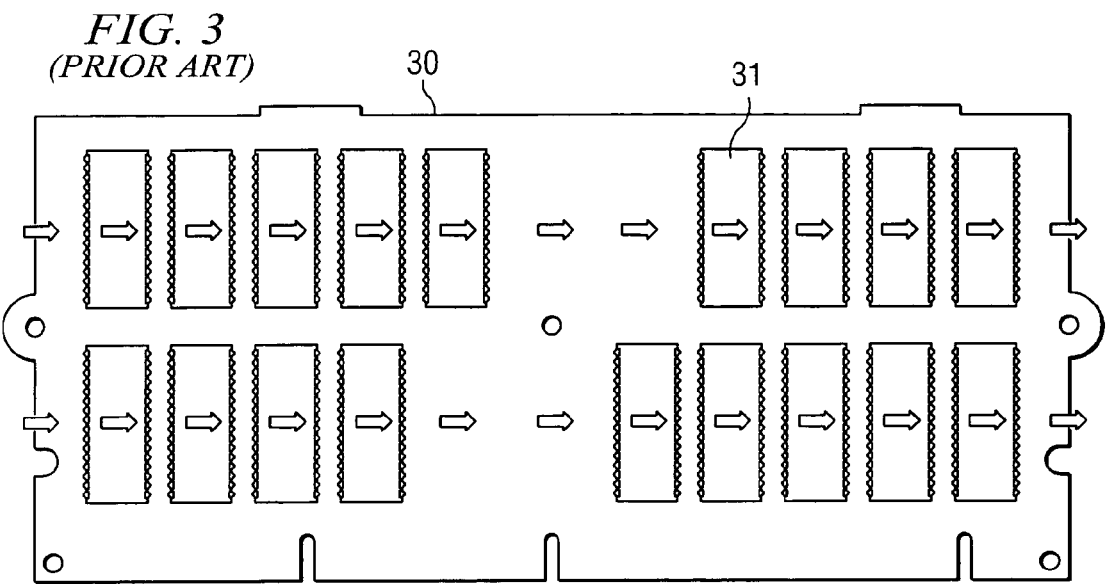
FIGS. 3 and 4 show prior art heat dissipating arrangements.
Figure 4:
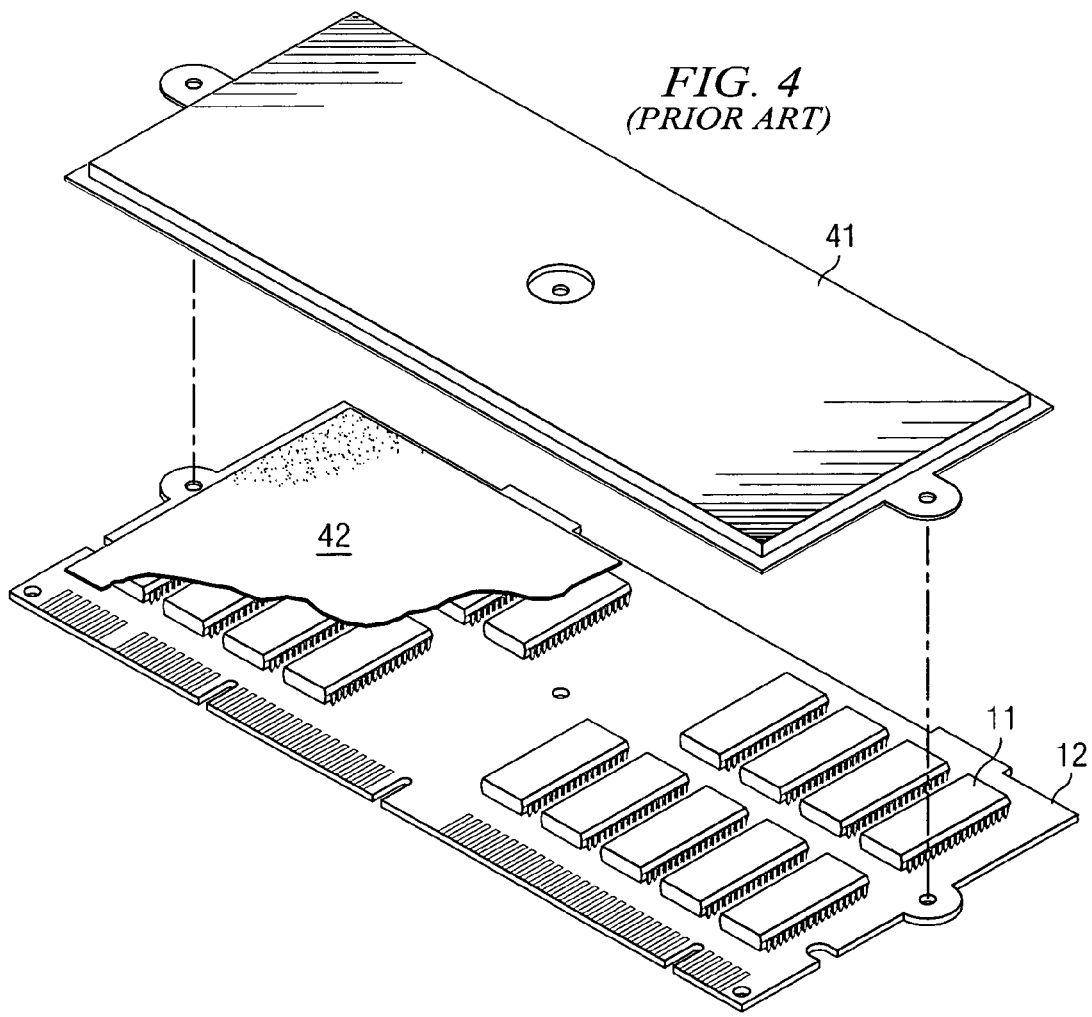

In providing heat dissipating package 10 according to an embodiment, devices 11 (which can be direct inline memory modules (DIMMs)) are soldered or otherwise connected to circuit board 12 via connectors 102 as shown in box 201 of FIG. 2. Device cover 15 is positioned over and/or on top of devices 11, as shown in box 202 of FIG. 2. Thereafter device cover 15 may be fastened via fasteners 101, such as may comprise screws, rivets, clips, or other convenient fastening means, via holes 100 to circuit board 12, as shown in box 203 of FIG. 2. Although fasteners 101 and holes 100 are shown in the illustrated embodiment, it should be appreciated that other fastening techniques may be used according to the present invention, such as the use of adhesives, solder, tab and receiver, etcetera, perhaps using rim 14 to fasten device cover 15 to circuit board 12.

Thermal material 13, such as may comprise the aforementioned heat transferring grease, is then inserted into the cavity between 12 and device cover 15, such as through a hole or holes (not shown) in circuit board 12 and/or cover 15, as shown in box 204 of FIG. 2. Because thermal material 13 is in a highly malleable form, it substantially fills the cavity between device cover 15 and circuit board 12, including the areas between devices 11 as well as against and/or between contacts 102, according to embodiments of the present invention. The filling of the cavity between device cover 15 and circuit board 12, including the areas between devices 11, by thermal material 13 is best seen in the cut-away view of FIG. 1B. It should be appreciated that thermal material 13 may be injected into the cavity with sufficient force to substantially fill the volume of the cavity, and will be held in place between circuit board 12 and device cover 15 due to device cover 15 being fastened to circuit board 12 in the illustrated embodiment.

After thermal material 13 is inserted, the cavity can be sealed as shown in box 205 of FIG. 2. For example, a solid barrier, solder, plastic, wax, or other material which presents a solid boundary to hold material 13 within the confines of the cavity between circuit board 12 and device cover 15 may be utilized to seal an orifice in device cover 15 and/or circuit board 12 through which thermal material 13 was introduced and/or through which the cavity was vented. The seal can be removable, if desired, so that material 13 can be removed or more material added at a later point in time.

According to embodiments of the invention, thermal material 13 can be applied before device cover 15 is positioned on top of devices 11 and/or can be inserted thereafter. Thermal material 13 will, in a one embodiment, actually cover devices 11, between devices 11, and inside device cover 15 to make better thermal contact between devices 11 and device cover 15.

In operation, air, as shown by arrows 110 of FIG. 1A, can then be moved over the outer surface of device cover 15 to cool devices 11. The air can be naturally circulating or can be enhanced by a fan (not shown).

Because thermal material 13 of certain embodiments of the present invention has a high heat transfer property and is in contact with both the surface of devices 11 as well as connectors 102, the heat from devices 11 is readily transferred to device cover 15. Device cover 15 of embodiments of the invention is advantageously made from a high heat transfer material such as, for example, aluminum, copper, or graphite. The outside surface of device cover 15 (and if desired the inside surface) may have a dimensional pattern or other configuration such that its surface area is greater than the planar surface area (length multiplied by width). For the embodiment illustrated, in FIG. 1B, strips 151 and 152 are at different heights so that the area that is in contact with the air is increased beyond the flat surface area otherwise presented by device cover 15 in covering devices 11. Embodiments of the invention may implement other patterns to increase the surface area on the outside of device cover 15. Such patterns could be straight or curved, with sides that are perpendicular to the surface or angular thereto, and/or may include pins, dimples, or other surface perturbations.

It should be noted, that one method of inserting thermal material 13 is by inserting thermal material 13 in the form of a grease or other highly malleable material between devices 11, including on top of devices 11 (not shown) and in and around devices 11. However, more solid material having cut outs for the devices can be positioned instead of a grease or other highly malleable material so that thermal material 13 becomes a single part or multiple parts if a highly malleable material, such as grease, is not utilized. When a highly malleable material, such as grease, is used as thermal material 13, it may be preferable to seal the outside of device cover 15, perhaps by a L-shaped bracket, such as formed by rim 14, around the perimeter of the circuit board to contain the material.

Figure 1B:
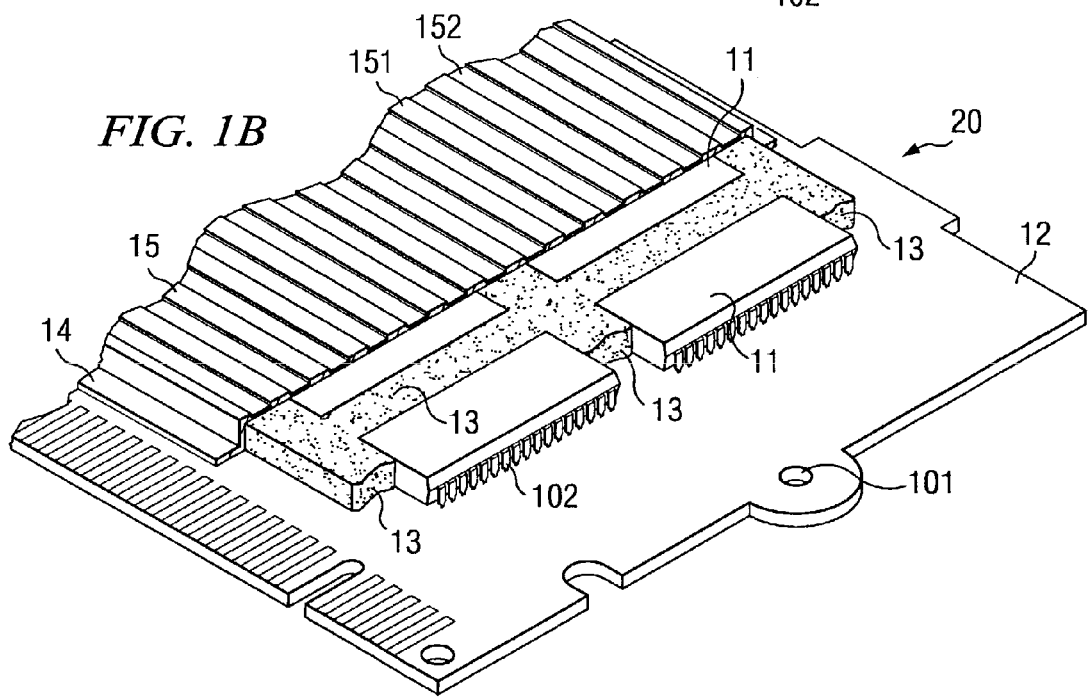
FIG. 1B shows a cut-away view of the heat dissipating package of FIG. 1A.
Figure 1C:
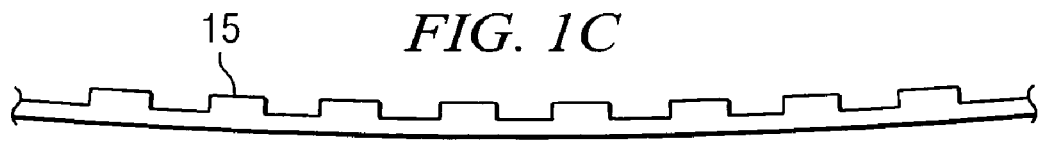
FIG. 1C shows a cut-away detail view of cover 15 of FIG. 1B.

It should be noted, that while not easily seen in FIG. 1B, but shown in greater detail in FIG. 1C, device cover 15 can be bowed slightly inward toward devices 11 so as to increase thermal contact between device cover 15 and devices 11 and/or material 13. Other techniques may additionally or alternatively be utilized to improve surface contact between device cover 15 and devices 11, such as relieving portions of the inside surface of device cover 15 to facilitate a better mating between the inside surface of device cover 15 and top and/or side surfaces of devices 11.

What is claimed is:

1. An electronic board comprising:
    a plurality of individual devices, each device having a plurality of connectors, said connectors mated to receptacles on said board; and
    a heat dissipating cover connected to said board and forming a cavity incarcerating said plurality of devices, said cover thermally contacting a plurality of said individual devices, said thermal contact being enhanced by an inward bow to said cover, said cover having a dimensional pattern such that its outer surface area is greater than its planar area.

2. The electronic board of claim 1 wherein when said cover is in place on said board, gaps exist between said individual devices, and wherein free-form thermally conductive material is present within said gaps.

3. The electronic board of claim 2 wherein said thermally conductive material is in physical contact with said connectors and said cover.

4. The electronic board of claim 2 further comprising at least one seal for maintaining said thermally conductive material within said cavity.

5. The electronic board of claim 4 wherein said seal is removable.

6. The electronic board of claim 1 wherein said electronic board is a DIMM carrier board and wherein said individual devices are DIMM devices.

7. A thermal conductivity cover for use in increasing heat dissipation from an electronic circuit board, said circuit board having a plurality of electronic devices electronically connected to said circuit board by connectors; said cover comprising:
    a plate having a relatively flat inner surface and having a planer area for thermally mating with ones of said electronic devices, said plate further having an outer surface for contact with air, said outer surface having an area greater than said planer area of said inner surface, wherein said inner surface is bowed towards said electronic devices; and
    a rim coupled to said plate sized and shaped to cooperate with said plate to incarcerate electronic devices of said plurality of electronic devices within a cavity defined by said rim, said plate, and said electronic circuit board.

8. The cover of claim 7 having means for allowing the impregnation of the area around said devices within said cavity with thermally conductive material while said plate is in mated relationship with said devices.

9. The cover of claim 7 wherein said plate is constructed from thermally conductive material.

* * * * *

UNITED STATES PATENT AND TRADEMARK OFFICE
CERTIFICATE OF CORRECTION

PATENT NO. : 6,967,843 B2
APPLICATION NO. : 10/364093
DATED : November 22, 2005
INVENTOR(S) : Brandon A. Rubenstein et al.

It is certified that error appears in the above-identified patent and that said Letters Patent is hereby corrected as shown below:

In column 1, line 60, delete "planer" and insert -- planar --, therefor.

In column 1, line 63, delete "planer" and insert -- planar --, therefor.

In column 4, line 48, in Claim 7, delete "planer" and insert -- planar --, therefor.

In column 4, line 51, in Claim 7, delete "planer" and insert -- planar --, therefor.

Signed and Sealed this

Fourth Day of August, 2009

JOHN DOLL
*Acting Director of the United States Patent and Trademark Office*